(12) United States Patent
Kang et al.

(10) Patent No.: US 8,723,283 B2
(45) Date of Patent: May 13, 2014

(54) OPTICAL MODULE

(75) Inventors: Sae-Kyoung Kang, Daejeon-si (KR);
Joon-Ki Lee, Daejeon-si (KR);
Joon-Young Huh, Daejeon-si (KR)

(73) Assignee: Electronics and Telecommunications Research Institute, Daejeon-Si (KR)

( * ) Notice: Subject to any disclaimer, the term of this patent is extended or adjusted under 35 U.S.C. 154(b) by 100 days.

(21) Appl. No.: 13/360,818

(22) Filed: Jan. 30, 2012

(65) Prior Publication Data

US 2012/0207437 A1    Aug. 16, 2012

(30) Foreign Application Priority Data

Feb. 10, 2011   (KR) .................. 10-2011-0012080
Oct. 17, 2011   (KR) .................. 10-2011-0106050

(51) Int. Cl.
*H01L 31/0203* (2006.01)

(52) U.S. Cl.
USPC ............. 257/433; 385/88; 257/431; 257/432; 257/99; 257/434; 361/728

(58) Field of Classification Search
USPC ......... 257/731, 732, 431–434, 99, 80, 81, 83; 361/748, 749, 761, 736; 385/92
See application file for complete search history.

(56) References Cited

U.S. PATENT DOCUMENTS

| | | | | |
|---|---|---|---|---|
| 5,632,630 | A * | 5/1997 | Card et al. | 439/79 |
| 5,897,384 | A * | 4/1999 | Hosler, Sr. | 439/63 |
| 7,073,958 | B2 * | 7/2006 | Oomori | 385/92 |
| 7,109,523 | B2 * | 9/2006 | Ishimura | 257/81 |
| 7,226,219 | B2 * | 6/2007 | Warashina et al. | 385/92 |
| 7,344,381 | B2 * | 3/2008 | Kerekes | 439/63 |
| 2002/0090844 | A1 * | 7/2002 | Kocin | 439/74 |
| 2004/0188698 | A1 * | 9/2004 | Ishimura | 257/99 |
| 2005/0121736 | A1 * | 6/2005 | Wang et al. | 257/432 |
| 2010/0176896 | A1 * | 7/2010 | Payne | 333/33 |

FOREIGN PATENT DOCUMENTS

| | | |
|---|---|---|
| JP | 2004-170808 A | 6/2004 |
| JP | 2005-142238 A | 6/2005 |
| KR | 10-0456308 | 10/2004 |
| WO | WO-2004/044637 A1 | 5/2004 |

OTHER PUBLICATIONS

Takuma Ban et al., "25-Gbps Receiver for 100-Gbps Ethernet employing Cost-effective Small Coaxial Package", 34th European Conference on Optical Communication (ECOC 2008), pp. 1-2, Sep. 21-25, 2008.

* cited by examiner

*Primary Examiner* — Lisa Lea Edmonds
*Assistant Examiner* — Keith Depew
(74) *Attorney, Agent, or Firm* — Rabin & Berdo, P.C.

(57) ABSTRACT

An optical module includes a stem, an optical element, data signal lead pins, a printed circuit board, and a post portion. The optical element is mounted on one surface of the stem. The data signal lead pins are connected to the optical element, and protrudes through the other surface of the stem. The printed circuit board has one surface on which data signal transmission lines for contact with the data signal lead pins are formed and the other surface on a part of which a stiffener is formed to protrude. The post portion protrudes from the other surface of the stem, supports the printed circuit board while in close contact with the stiffener such that the data signal lead pins can contact the data signal transmission lines while being disposed linearly above the data signal transmission lines, and includes a coupling portion to be coupled with the stiffener.

20 Claims, 10 Drawing Sheets

OPTICAL MODULE

CROSS-REFERENCE TO RELATED APPLICATION(S)

This application claims the benefit under 35 U.S.C. §119 (a) of Korean Patent Application Nos. 10-2010-0012080, filed on Feb. 10, 2010, and 10-2011-0106050, filed on Oct. 17, 2011, in the Korean Intellectual Property Office, the entire disclosures of which are incorporated herein by references for all purposes.

BACKGROUND

1. Field

The following description relates to an optical module, and more particularly, to an optical module which is improved in structure to operate fast.

2. Description of the Related Art

As an optical communications system has been faster and smaller, a conventional transistor outline-CAN (TO-CAN)-type optical module has increasingly experienced electrical characteristic restrictions at a speed of 10 Gbps or more. This is because most of currently used TO-CAN packages have a signal flow path that is bent at 90 degrees when the TO-CAN package is connected with a flexible printed circuit board (FPCB).

FIG. 1 is a diagram illustrating an example of a connection between a conventional TO-CAN package and a FPCB. Referring to FIG. 1, a transmission line 11 of the FPCB 10 has a through-hole 12. After a lead pin 21 of the TO-CAN package 20 is inserted into the through-hole 12, the lead pin 21 and the through-hole 12 are bonded together by soldering, and thereby the lead pin 21 can contact the transmission line 11 of the FPCB 10. Accordingly, a signal flow path that is bent at 90 degrees is produced between the lead pin 21 and the transmission line 11. In this case, if the lead pin 21 is a data signal lead pin, an impedance discontinuity is generated in a contacting portion between the data signal lead pin 21 and the through-hole 12, which may degrade signal integrity.

A graph illustrated in FIG. 2 shows the effects of the impedance discontinuity on signal integrity. The graph shown in FIG. 2 is obtained under assumption that the FPCB 10 has a transmission range of 12 mm and a characteristic impedance of 50Ω. As shown in FIG. 2, in a high frequency band, a transmission loss S21 is growing and a reflection value S11 is increased, and hence it is apprehended that the structure shown in FIG. 1 is not effective to be used in a high frequency band.

Meanwhile, there has been introduced a TO-CAN package which has significantly improved the electrical characteristics by coating multiple insulating layers on a lead for fast operation. However, the manufacturing cost for TO-CAN package may be increased by the complexity of the structure.

SUMMARY

Exemplary embodiments of the present invention is to provide an optical module which allows a data signal flow path between a data signal lead pin and a printed circuit board to be formed in a straight line without being bent, thereby being able to be used for a high transfer rate and be manufactured at small cost.

In one general aspect, there is provided an optical module including: a stem; an optical element mounted on one surface of the stem; data signal lead pins configured to be connected to the optical element, and to protruding through the other surface of the stem after passing through the stem; a printed circuit board configured to have one surface on which data signal transmission lines for contact with the data signal lead pins are formed and the other surface on a part of which a stiffener is formed to protrude; and a post portion configured to protrude from the other surface of the stem, to support the printed circuit board while in close contact with the stiffener such that the data signal lead pins can contact the data signal transmission lines while being disposed linearly above the data signal transmission lines, and to comprise a coupling portion to be coupled with the stiffener.

Other features and aspects may be apparent from the following detailed description, the drawings, and the claims.

Figure 1:
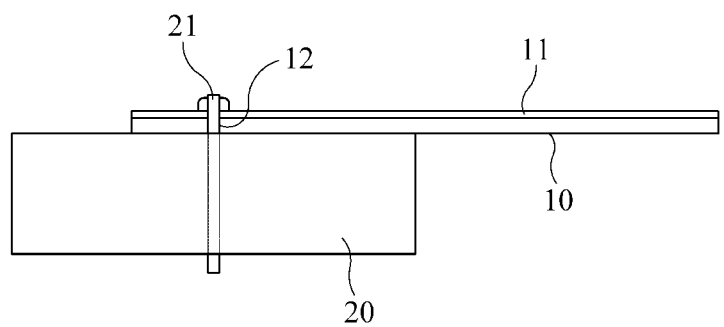
FIG. 1 is a diagram illustrating an example of a connection between a conventional TO-CAN package and a FPCB.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 3:
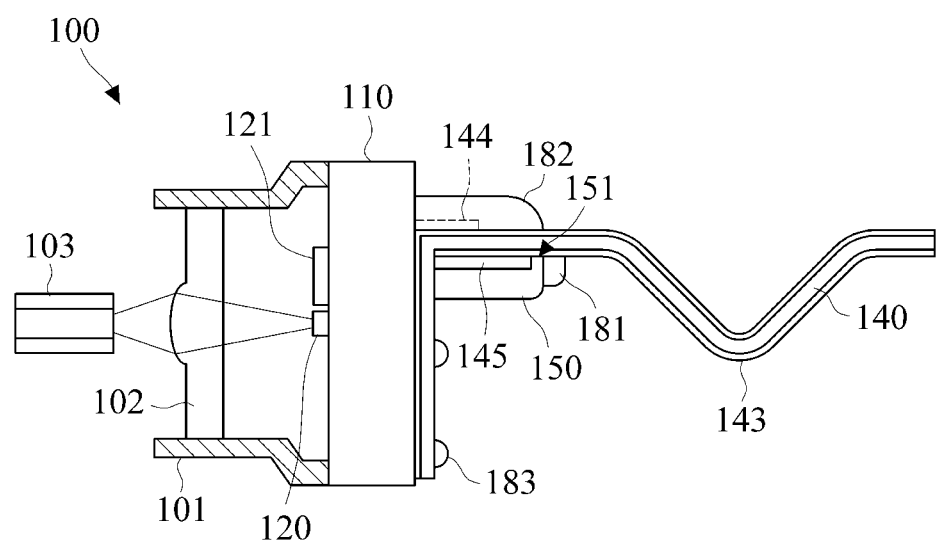
FIG. 3 is a diagram illustrating an example of an optical module.
Figure 4:
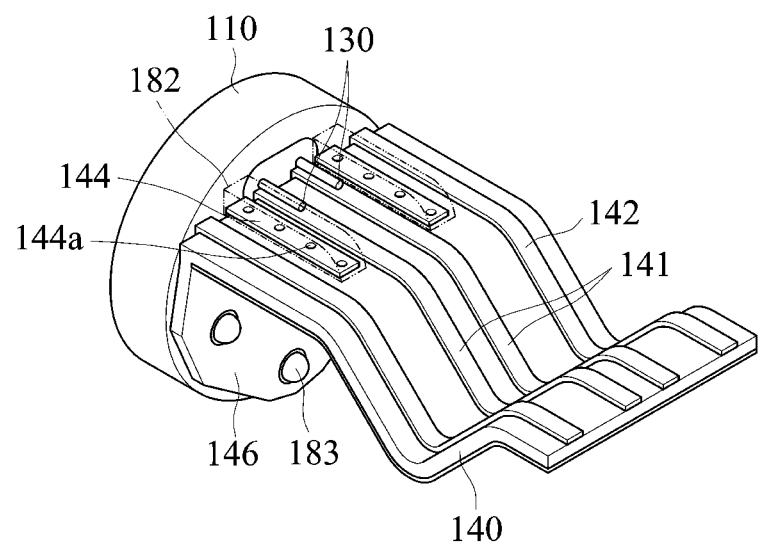
FIG. 4 is a diagram illustrating an example of a stem shown in FIG. 3, which is connected with a printed circuit board.
Figure 5:
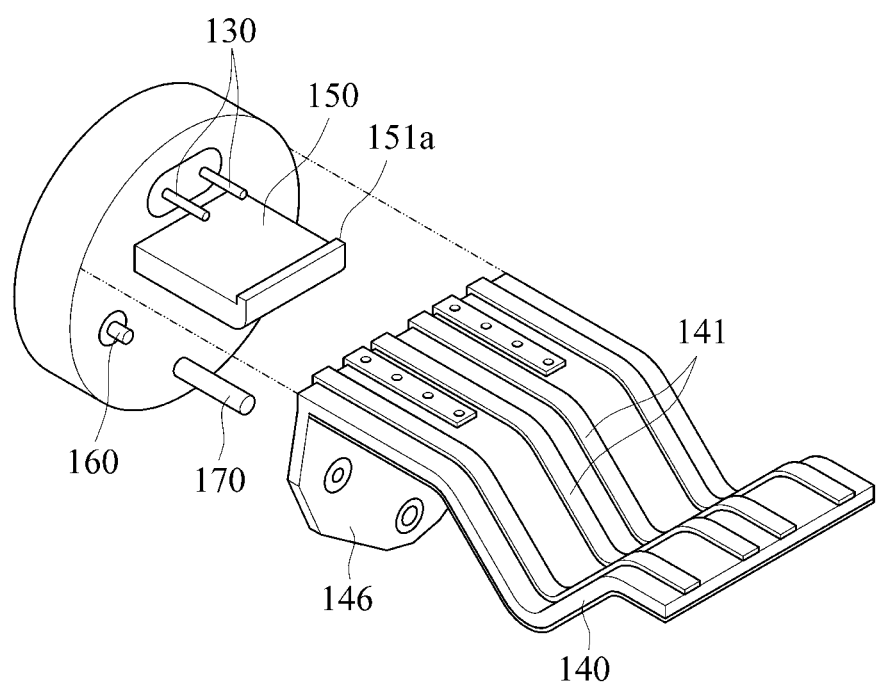
FIG. 5 is a diagram illustrating an exploded perspective view of the stem shown in FIG. 4.
Figure 6:
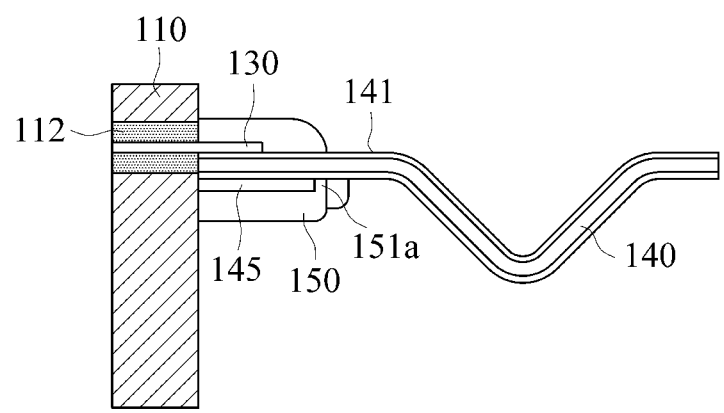
FIG. 6 is a diagram illustrating a side view of the connection between a data signal lead pin and a data signal transmission line shown in the example illustrated in FIG. 3.

FIG. 3 is a diagram illustrating an example of an optical module. FIG. 4 is a diagram illustrating an example of a stem shown in FIG. 3, which is connected with a printed circuit board. FIG. 5 is a diagram illustrating an exploded perspective view of the stem shown in FIG. 4. FIG. 6 is a diagram illustrating a side view of the connection between a data signal lead pin and a data signal transmission line shown in the example illustrated in FIG. 3.

Referring to FIGS. 3 to 6, optical module 100 may include a stem 110, an optical element 120, data signal lead pins 130, a printed circuit board 140, and a post portion 150.

The stem 110 may act as a base of the optical module 100. The optical element 120 may be mounted on one surface of the stem 110. On the same surface of the stem 110 as the optical element being mounted, an electronic element 121 may be mounted as well. A sub-mount (not shown) may be mounted on the stem 110, and the optical element 120 and the electronic element 121 may be mounted on the sub-mount.

If the optical module 100 functions to receive light, the optical element 120 may include a light receiving element such as a photo diode. The electronic element 121 may include a trans-impedance amplifier (TIA) to amplify a current signal, which is output from a light receiving element, to a voltage signal. If the optical module 100 functions as transmit light, the optical element 120 may include a light emitting element such as a laser diode. In this case, the electronic element 121 may include a photo diode for monitoring optical power of the light emitting element.

On the surface of the stem 110 having the optical element 120 and the electronic element 121 mounted thereon, a cap 101 may be provided to encapsulate the optical element 120 and the electronic element 121 for protection. The cap 101 may have an inner space and both ends opened. With the optical element 120 and the electronic element 121 being accommodated in the inner space of the cap 101, one open end of the cap 101 is connected to the surface of the stem 110 on which the optical element 120 and the electronic element 121 are mounted. The other open end of the cap 101 may have a lens 102 installed therein. The lens 102 is provided for alignment between an optical fiber 103 and the optical element 120.

The data signal lead pins 130 may pass through the stem 110 and protrude through the other surface of the stem 110, that is, the opposite surface to the surface on which the optical element 120 and the electronic element 121 are mounted. The data signal lead pins 130 may protrude in a perpendicular direction to the other surface of the stem 110. The data signal lead pins 130 may be connected to the optical element 120.

The data signal transmission lines 141 may be formed on one surface of the printed circuit board 140 to be connected with the data signal lead pins 130. The data signal transmission lines 141 may be arranged on the printed circuit board 140 at the same intervals as the data signal lead pins 130. A stiffener 145 may protrude from a part of the other surface of the printed circuit board 140.

The post portion 150 may protrude from the other surface of the stem 110. When with the other surface of the printed circuit board 140 facing toward the post portion 150, the printed circuit board 140 is inserted between the post portion 150 and the data signal lead pins 130, the post portion 150 may support the printed circuit board 140 while being in tight contact with the stiffener 145 such that the data signal lead pins 130 can be disposed linearly above the data signal transmission lines 141 and contact the data signal transmission lines 141.

In addition, the post portion 150 may include a coupling portion 151 to be coupled with the stiffener 145. The coupling portion 151 of the post portion 150 may allow the post portion 150 to support the printed circuit board 140 more stably in comparison with a conventional structure in which the stiffener 145 simply contacts the post portion 150 without the coupling portion 151. Accordingly, the data signal lead pins 130 can be maintained in more stably contact with the data signal transmission lines 141.

As described above, since the data signal lead pins 130 are in contact with the data signal transmission lines 141 while being disposed linearly above the data signal transmission lines 141, a flow path of a data signal is not curved, but is formed in a straight line. In comparison with a conventional structure illustrated in FIG. 1, the straight flow path may be advantageous in a contacting portion between the data signal lead pin 130 and the data signal transmission line 141 in terms of frequency bandwidth restriction and signal integrity due to discontinuous impedance. Hence, the optical module 100 may be operable at higher transfer rate compared to the conventional optical module, and may be advantageous in reducing manufacturing cost since the optical module 100 can operate fast without coating multiple insulating layers on each of the data signal lead pins 130.

As shown in FIG. 6, the stiffener 145 may have an end extending toward one end of the printed circuit board 140 so as to closely contact the other surface of the stem 110, and the coupling portion 151 may include a bent portion 151a that is bent from the protruding end of the post portion 150 while in closely contact with the other end of the stiffener 145 and extends to contact the other surface of the printed circuit board 140. For example, the bent portion 151a may be integrated with the post portion 150, and the post portion 150 including the bent portion 151a may be in an L-shape.

Accordingly, one end of the stiffener 145 comes to contact the other surface of the stem 110 and the other end of the stiffener 145 comes to closely contact an inner surface of the bent portion 151a, so that one end of the printed circuit board 140 can be supported in close contact with the other surface of the stem 110. Thus, in a case of the data signal transmission lines 141 extending to one end of the printed circuit board 140, the data signal lead pins 130 can contact the data signal transmission lines 141 without an air gap therebetween. As a result, a contacting portion between the data signal lead pins 130 and the data signal transmission lines 141 does not have an impedance discontinuity in a high frequency band, and thus signal distortion may be prevented.

In the case of the stiffener 145 with a constant thickness, the post portion 150 may have a flat surface to contact the stiffener 145, thereby stably supporting the printed circuit board 140. In the examples illustrated in FIGS. 3 to 6, the post portion 150 is illustrated as being hexahedral and having a protruding end on which the bent portion 151a is formed, but the post portion 150 may be provided in a half cylinder shape and have a protruding end on which the bent portion 151a is formed. In the case of the post portion 150 formed as a half-cylinder, a flat surface of the half cylinder may be positioned to close contact the stiffener 145. In addition, a position of the post portion 150 may vary according to the thickness of the printed circuit board 140 and a position of an input/output of the optical element and the electronic element. For example, as will be described later, the post portion 150 may be located on an upper surface of a dielectric 112 filled inside the stem 110 to enclose a circumference of each of the data signal lead pins 130.

The stem 110 may be a transistor outline (TO) stem made of a metal material. In addition, the post portion 150 may be made of the same material as the stem 110. That is, the stem 110 and the post portion 150 may be integrated into one structure made of the same material. Thus, the post portion 150 may be able to support the printed circuit board 140 more stably.

The other surface of the printed circuit board 140, that is, a surface facing the post portion 150, may have a ground portion 143 formed thereon. In this case, the bent portion 151a may be bonded to the ground portion 143 by a soldering portion 181 that is generated by soldering process. Accordingly, the printed circuit board 140 may be able to be supported more firmly by the post portion 150, while being physically in contact with the other surface of the stem 110. In addition, if the bent portion 151a and the post portion 150 are made of a conductive metal material, the post portion 150 may be electrically grounded.

The printed circuit board 140 may have ground pads 144, between which the data signal transmission lines 141 are arranged. The ground pads 144 may contact the ground portion 143 through vias 144a. The ground pads 144 may reduce signal distortion at the outer edges of the data signal transmission lines 141. The ground pads 144 may be bonded to the other surface of the stem 110 by the soldering portion 182. Hence, the ground portion 143 of the printed circuit board 140 is enabled to be connected to the ground of the stem 110, and thus inductance components on a carrier current path for the signal transmission may be reduced. In addition, the printed circuit board 140 may be more firmly connected to the other surface of the stem 110 while in close contact with the stem 110.

In a case in which the printed circuit board 140 is a very thin flexible printed circuit board with a thickness of about 100 μm the flexible printed circuit board may have difficulties when it is bonded to the stem 110 by soldering process, due to the high flexibility which causes the flexible printed circuit board to be curved at high temperature during the soldering process. At this time, the stiffener 145 is rested on the post portion 150, and has one end in close contact with the other surface of the stem 110 and the other end in close contact with an inner surface of the bent portion 151a, thereby allowing the flexible printed circuit board to be in close contact with and bonded to the stem 110 without having any portions curved. To improve the above effects, the stiffener 145 may be coated with a polymer material or an electrically insulating material and formed on the printed circuit board 140.

The optical module 100 may include driving signal lead pins 160. The driving signal lead pins 160 may pass through the stem 110, and protrude through the other surface of the stem 110, that is, the opposite surface of the surface on which the optical element 120 and the electronic element 121 are mounted. Each of the driving signal lead pins 160 may protrude from the other surface of the stem 110 in a perpendicular direction of the other surface. The driving signal lead pins 160 may be connected to the optical element 120 or the electronic element 121 by wire bonding, etc. The driving signal lead pins 160 may transfer received power or monitor/control signals to the optical element 120 or the electronic element 121. The driving signal lead pins 160 may be disposed farther than the data signal lead pins 130 from the post portion 150.

In addition, the printed circuit board 140 may have driving signal transmission lines 142 to contact the driving signal lead pins 160. The data signal transmission lines 141 may be arranged along the middle of the printed circuit board 140, and the driving signal transmission lines 142 may be arranged along each edge of the printed circuit board 140.

The printed circuit board 140 may include a board extension portion 146. The substrate extension portion 146 extending from the end of the printed circuit board 140 that faces toward the stem 110 may be bent to reach the driving signal lead pins 160 while in close contact with the other surface of the stem 110. The driving signal transmission lines 142 may extend up to the board extension portion 146 and come to contact the driving signal lead pins 160. In this case, the driving signal lead pins 160 may pass through the board extension portion 146 and be bonded to the respective driving signal transmission lines 142 by a soldering portion 183. Accordingly, the board extension portion 146 can be in close contact with the other surface of the stem 110 and be firmly supported by the stem 110.

The board extension portion 146 may be provided or not according to the inner configuration of the optical module 100. The printed circuit board 140 may be a flexible printed circuit board, but a type of the printed circuit board 140 is not limited thereto. In some cases, the printed circuit board 140 may be a rigid printed circuit board. In addition, the shape of the printed circuit board 140 may be varied according to the configuration and positions of the driving signal lead pins 160.

Referring back to FIG. 5, a alignment ground lead pin 170 may protrude from the other surface of the stem 110 to apply power to an external optical alignment device. The alignment ground lead pin 170 may be varied in position on the stem 110. The alignment ground lead pin 170 may be discarded after use.

Figure 7:
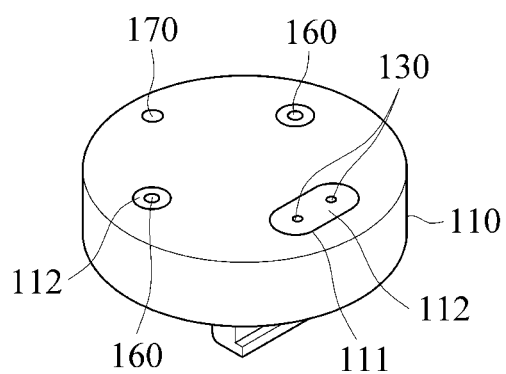
FIG. 7 is a diagram illustrating an example of a surface of a stem on which an optical element and an electronic element are mounted as shown in the example illustrated in FIG. 3.

As shown in FIG. 7, the stem 110 may have through-holes 111 through which the data signal lead pins 130 pass, and each of the through-holes 111 may be filled with dielectric 112 to enclose each of the data signal lead pins 130. Here, at least a minimum length of the data signal lead pins 130 may protrude from one surface of the stem 110. This is to prevent signal distortion which may be caused by an impedance discontinuity in a high frequency band when the data signal lead pins 130 protrudes more than the dielectric 112. In addition, the stem 110 further include through-holes 111 through each of which each of the driving signal lead pins 160 passes, and each of the through holes 111 may be filled with a dielectric 112 to enclose the driving signal lead pin 160.

Figure 2:
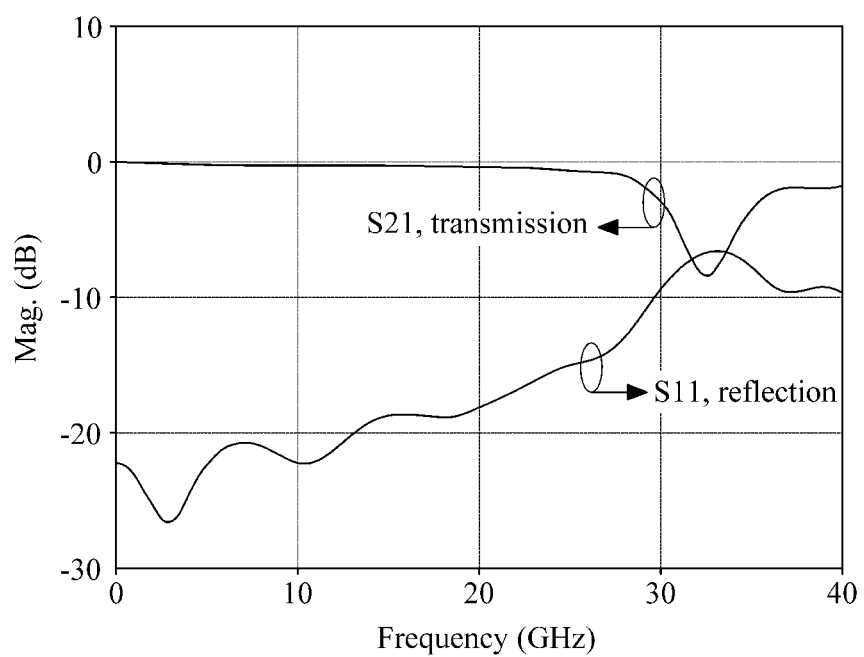
FIG. 2 is a graph showing electrical characteristics of a TO-CAN package having a connection structure as shown in FIG. 1.
Figure 8:
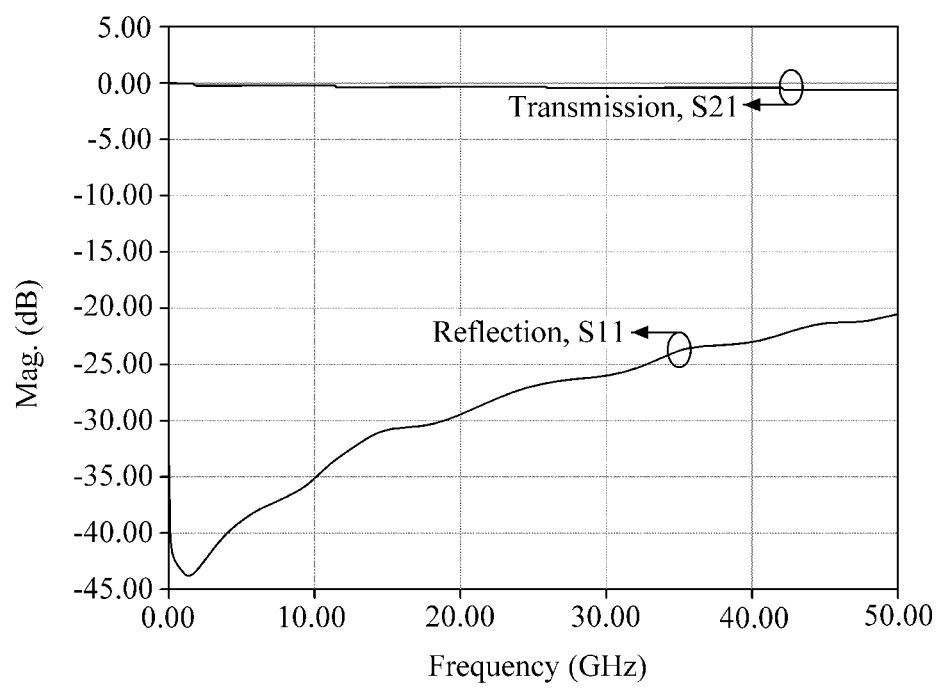
FIG. 8 is a graph showing electrical characteristics of an optical module shown in FIG. 3.

The optical module 100 as shown in the example illustrated in FIGS. 3 to 7 is superior in electrical characteristics to a conventional optical module. A graph illustrated in FIG. 8 shows the electrical characteristics of the optical module 100. The graph is obtained from the computation by HFSS simulation tool from ANSYS, Inc. As shown in FIG. 8, until reaching 40 GHz, a transmission loss S21 is –0.6 dB and a reflection value S11 is –21 dB. Thus, in comparison with a graph illustrated in FIG. 2, it is appreciated that the optical module 100 in the above examples is superior for use in a high frequency band.

Figure 9:
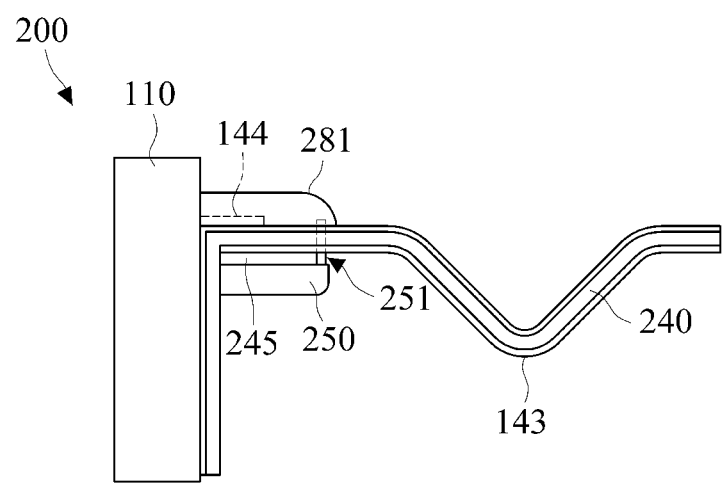
FIG. 9 is a diagram illustrating a side view of another example of an optical module.
Figure 10:
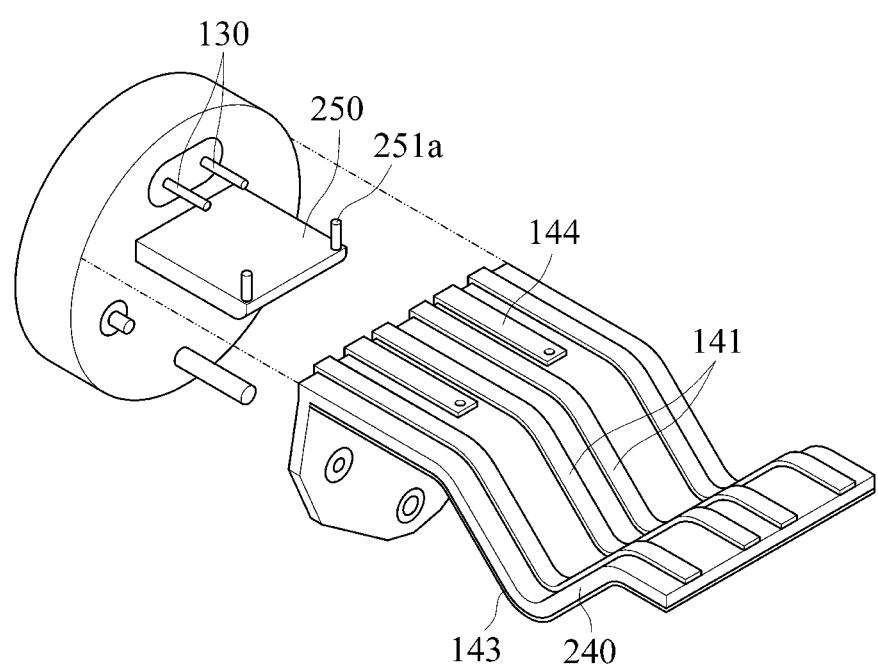
FIG. 10 is a diagram illustrating an exploded perspective view of the optical module illustrated in FIG. 9.

FIG. 9 is a diagram illustrating a side view of another example of an optical module. FIG. 10 is a diagram illustrating an exploded perspective view of the optical module illustrated in FIG. 9. In FIGS. 9 and 10, the same drawing reference numerals refer to the same elements in FIGS. 3 to 7, and thus detailed description thereof will not be reiterated.

Referring to FIGS. 9 and 10, optical module 200 is different from the optical module 100 shown in the example illustrated in FIG. 3 in that a printed circuit board 240 is coupled with a post portion 250. More specifically, a coupling portion 251 of the post portion 250 may include a projection pin 251a that is disposed close to an end of a stiffener 245 and protrudes to pass through the stiffener 245 and the printed circuit board 240.

The projection pin 251a may be disposed close to a protruding end of the post portion 250 and may be provided in a cylinder shape with a predetermined height and diameter. There may be two or more projection pins 251a to be more firmly coupled with the stiffener 245. In this case, the projection pins 251a may be spaced apart from each other along a width direction of the post portion 250.

The projection pin 251a may be formed to pass through a ground pad 144 to connect a ground portion 143 with the ground pad 144. In addition, the projection pin 215a may be bonded to the ground pad 144 via a soldering portion 281. The soldering portion 281 may be extended so as to bond the ground pad 144 to a surface of a stem 110, and thus all of the projection pin 251a, the ground pad 144 and the stem 110 can be bonded together. Accordingly, the printed circuit board 240 as a flexible printed circuit board with a thickness of about 100 µm may be physically firmly supported when being closely fixed to the stem 110. Moreover, if the post portion 250 and the projection pin 251a are made of a conductive metal material, the post portion 250 may be electrically grounded.

Like the optical module 100 shown in the example illustrated in FIG. 3, data signal lead pins 130 may be disposed linearly above data signal transmission lines 141 of the printed circuit board 240, respectively, and thus they can stably contact with each other. It may be appreciated that a computation result of a transmission loss and a reflection value of the optical module 200 is similar as that of the optical module 100 shown in the example illustrated in FIG. 3.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An optical module comprising:
    a stem;
    an optical element mounted on a surface of the stem;
    data signal lead pins connected to the optical element and extending in a given direction to protrude through an other surface of the stem after passing through the stem;
    a printed circuit board having on one surface thereof data signal transmission lines extending in said given direction for contact with the data signal lead pins and with the other surface of the printed circuit board on a part of which a stiffener is formed to protrude; and
    a post portion protruding from the other surface of the stem, to support the printed circuit board while in close contact with the stiffener such that the data signal lead pins contact the respective data signal transmission lines, and including a coupling portion coupled with the stiffener.

2. The optical module of claim 1, wherein the stiffener has one end extending to an end of the printed circuit board and in close contact with the other surface of the stem and the coupling portion has
    a bent portion bending from a protruding end of the post portion,
    a surface in close contact with an other end of the stiffener and
    an other surface in close contact with the other surface of the printed circuit board.

3. The optical module of claim 2, wherein the stem is a transistor outline (TO) stem made of a metal material and the post portion is made of the same material as the TO stem.

4. The optical module of claim 3, wherein the printed circuit board has a ground portion on the other surface thereof and the bent portion is solder-bonded to the ground portion.

5. The optical module of claim 3, wherein one surface of the printed circuit board has ground pads on each side to be in contact with a ground portion through vias, wherein the data signal transmission lines are disposed between the ground pads, and the ground pads are solder-bonded to the other surface of the stem.

6. The optical module of claim 1, wherein the stiffener has one end extending to one end of the printed circuit board and the coupling portion has a projection pin disposed close to an end of the stiffener and protruding from the stiffener and the printed circuit board after passing through the stiffener and the printed circuit board.

7. The optical module of claim 6, wherein the stem is a TO stem made of a metal material and the post portion is made of the same material as the TO stem.

8. The optical module of claim 7, wherein the printed circuit board has one surface on which ground pads are formed at each side and the data signal transmission lines are disposed between the ground pads, and the other surface on which a ground portion is formed, the projection pin is configured to protrude through the ground pads to allow the ground portion to contact the ground pads, and the ground pads are bonded to both the other surface of the stem and the projection pin by soldering.

9. The optical module of claim 1, further comprising:
    driving signal lead pins connected to the optical element, and extending in the given direction to protrude through the other surface of the stem after passing through the stem,
    wherein the printed circuit board has along edges thereof driving signal transmission lines, and has a board extension portion extending from an end of the printed circuit board that faces the other surface of the stem, and bending in close contact with the other surface of the stem and the driving signal transmission lines extending as far as the board extension portion extends and contacting the driving signal lead pins, wherein the data signal transmission lines are disposed between the driving signal transmission lines.

10. The optical module of claim 9, wherein the driving signal lead pins are configured to pass through the board extension portion and be bonded to the respective driving signal transmission lines by soldering.

11. The optical module of claim 1, further comprising:
    an alignment ground lead pin protruding from the other surface of the stem so as to apply power to an external optical alignment device.

12. The optical module of claim 1, wherein the stem has through holes through which the data signal lead pins pass and each of the through holes is filled with a dielectric surrounding each of the data signal lead pins.

13. The optical module of claim 12, wherein the data signal lead pins are configured to protrude not more than the dielectric from the surface of the stem.

14. The optical module of claim 1, wherein the printed circuit board is a flexible printed circuit board or a rigid printed circuit board.

15. An optical module comprising:
    a stem having a first stem surface and an opposite, second stem surface;
    an optical element disposed on said first stem surface;
    a pair of data signal lead pins disposed on said second stem surface connected to the optical element and spaced apart from each other by a given interval, said lead pins extending in a direction that is perpendicular to said second stem surface;
    a printed circuit board having opposite first and second board surfaces, said printed circuit board having a first end disposed on the second stem surface and extending in said direction;
    a pair of data signal transmission lines disposed parallelly on said first board surface, extending in said direction and spaced apart from each other a distance equal to said given interval, and so as to be in side-to-side contact with the respective data signal lead pins;
    a stiffener, said stiffener disposed on said second board surface,
having a first stiffener end in contact with the second stem surface, and
extending from said second stem surface in said direction; and
a post portion disposed at one end on the second stem surface and having a coupling portion at an opposite end, said post portion extending from said second stem surface in said direction in contact with the stiffener, said stiffener disposed between said circuit board and said post portion.

16. An optical module of claim 15, wherein the coupling portion has
a bent portion bending perpendicularly to said direction from said opposite end of the post portion,
a first coupling surface at an end of said bent portion in close contact with the stiffener at a second stiffener end opposite said first stiffener end, and
a second coupling surface in close contact with the second board surface.

17. An optical module of claim 15, wherein the coupling portion has a projection pin, extending close to the second stiffener end and passing through the printed circuit board in a direction that is perpendicular to the stiffener.

18. An optical module of claim 15, further comprising:
driving signal lead pins disposed on the second stem surface, extending in said direction, and
driving signal transmission lines disposed parallelly on the first board surface along edges thereof, between the driving signal transmission lines,
wherein said printed circuit board has an extension portion at said first board end extending along and mounted to said second stem surface, and
wherein the driving signal transmission lines extend along the board extension portion into contact the driving signal lead pins.

19. An optical module of claim 15, further comprising an alignment ground lead pin disposed on the second stem surface, extending in said direction and applying power to an external optical alignment device.

20. An optical module of claim 15, wherein the stem has through holes through which the data signal lead pins pass, and each of the through holes is filled with a dielectric surrounding each of the data signal lead pins.

* * * * *